US012669796B2

(12) United States Patent
Atev

(10) Patent No.: US 12,669,796 B2
(45) Date of Patent: Jun. 30, 2026

(54) METHODS AND SYSTEMS FOR GENERATING AN INSTANTANEOUS QUOTE OF ANY PART WITHOUT TOOLPATHING

(71) Applicant: PROTOLABS, INC., Maple Plain, MN (US)

(72) Inventor: Stefan Emilov Atev, Bethesda, MD (US)

(73) Assignee: Protolabs, Inc., Maple Plain, MN (US)

( * ) Notice: Subject to any disclaimer, the term of this patent is extended or adjusted under 35 U.S.C. 154(b) by 1208 days.

(21) Appl. No.: 17/395,119

(22) Filed: Aug. 5, 2021

(65) Prior Publication Data

US 2023/0042464 A1 Feb. 9, 2023

(51) Int. Cl.
| | |
|---|---|
| *G05B 19/406* | (2006.01) |
| *G06F 30/20* | (2020.01) |
| *G06N 20/00* | (2019.01) |

(52) U.S. Cl.
CPC ........... *G05B 19/406* (2013.01); *G06F 30/20* (2020.01); *G06N 20/00* (2019.01); *G05B 2219/35212* (2013.01)

(58) Field of Classification Search
CPC ................. G05B 19/406; G05B 19/19; G05B 2219/35212; G05B 2219/31408; G05B 2219/31412; G05B 2219/31415; G05B 19/41885; G05B 19/41865; G06F 30/20; G06F 30/25; G06F 30/27; G06F 30/28; G06N 20/00; G06N 3/044; G06N 3/0442; G06N 3/0464; G06N 3/04; G06N 3/084; G06N 5/01; G06N 7/01; G06N 20/10; G06N 20/20
See application file for complete search history.

(56) References Cited

U.S. PATENT DOCUMENTS

| | | | |
|---|---|---|---|
| 5,495,430 | A | 2/1996 | Matsunari et al. |
| 7,305,367 | B1 | 12/2007 | Hollis et al. |

(Continued)

FOREIGN PATENT DOCUMENTS

WO 2020229624 11/2020

OTHER PUBLICATIONS

Armillotta, Antonio. "On the role of complexity in machining time estimation." Journal of Intelligent Manufacturing 32.8 (2021): 2281-2299. (Year: 2021).*

(Continued)

*Primary Examiner* — Michael Edward Cocchi

(74) *Attorney, Agent, or Firm* — Caldwell LLC

(57) ABSTRACT

Methods and In an aspect a method of generating an instantaneous quote of any part without toolpathing, the method includes receiving, using a computing device, a geometric model of a part, constructing, using the computing device, at least a rotation-invariant feature as a function of the geometric model, predicting, using the computing device, a manufacturing time as a function of the at least a rotation-invariant feature and a manufacturing time machine learning model, selecting, using the computing device, a stock as a function of the at least a rotation-invariant and a stock selection machine learning model feature, and estimating, using the computing device, a quote as a function of the manufacturing time and the stock.

16 Claims, 6 Drawing Sheets

(56) References Cited

U.S. PATENT DOCUMENTS

| 8,140,401 | B2 * | 3/2012 | Lukis | G06Q 30/06 |
| | | | | 705/26.1 |
| 2012/0278263 | A1 * | 11/2012 | Borthwick | G06N 20/00 |
| | | | | 706/12 |
| 2013/0297058 | A1 * | 11/2013 | Griffith | G06F 30/00 |
| | | | | 700/98 |
| 2015/0127480 | A1 * | 5/2015 | Herrman | G06Q 30/0611 |
| | | | | 705/26.4 |
| 2018/0120813 | A1 * | 5/2018 | Coffman | G06N 20/00 |
| 2020/0348646 | A1 | 11/2020 | Coffman et al. | |
| 2020/0372558 | A1 * | 11/2020 | Herrman | G06Q 30/0283 |
| 2020/0409377 | A1 * | 12/2020 | Ready-Campbell | ......................... |
| | | | | G05D 1/0212 |

OTHER PUBLICATIONS

Soyoung Yoo, Namwoo Kang, Explainable Artificial Intelligence for Manufacturing Cost Estimation and Machining Feature Visualization, Oct. 28, 2020.
Jean-Loup Loyer, Elsa Henriques, Mihail Fontul, Steve Wiseall, Comparison of Machine Learning methods applied to the estimation of manufacturing cost of jet engine components, Dec. 31, 2016.
Šarić, Tomislav & Šimunović, Goran & Simunovic, K. & Svalina, Ilija. , Estimation of Machining Time for CNC Manufacturing Using Neural Computing, Dec. 31, 2016.
Antonio Armillotta, On the role of complexity in machining time estimation, Feb. 7, 2021.

* cited by examiner

METHODS AND SYSTEMS FOR GENERATING AN INSTANTANEOUS QUOTE OF ANY PART WITHOUT TOOLPATHING

FIELD OF THE INVENTION

The present invention generally relates to the field of artificial intelligence, simulation, and modeling. In particular, the present invention is directed to methods and systems for generating an instantaneous quote of any part without toolpathing.

BACKGROUND

In recent years custom manufacturing of parts has made use of automated methods for quoting. However, automated quoting is often not instantaneous and requires expensive computational power to perform. In many cases, automated quoted of custom manufactured parts requires user oversight to ensure that quoting is performed accurately with reasonable manufacturing inputs.

SUMMARY OF THE DISCLOSURE

In an aspect a method of generating an instantaneous quote of any part without toolpathing, the method includes receiving, using a computing device, a geometric model of a part, constructing, using the computing device, at least a rotation-invariant feature as a function of the geometric model, predicting, using the computing device, a manufacturing time as a function of the at least a rotation-invariant feature and a manufacturing time machine learning model, selecting, using the computing device, a stock as a function of the at least a rotation-invariant and a stock selection machine learning model feature, and estimating, using the computing device, a quote as a function of the manufacturing time and the stock.

In another aspect a system for generating an instantaneous quote of any part without toolpathing, the system including a computing device configured to receive a geometric model of a part, construct at least a rotation-invariant feature as a function of the geometric model, predict a manufacturing time as a function of the at least a rotation-invariant feature and a manufacturing time machine learning model, select a stock as a function of the at least a rotation-invariant and a stock selection machine learning model feature, and estimate a quote as a function of the manufacturing time and the stock.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

Figure 1:
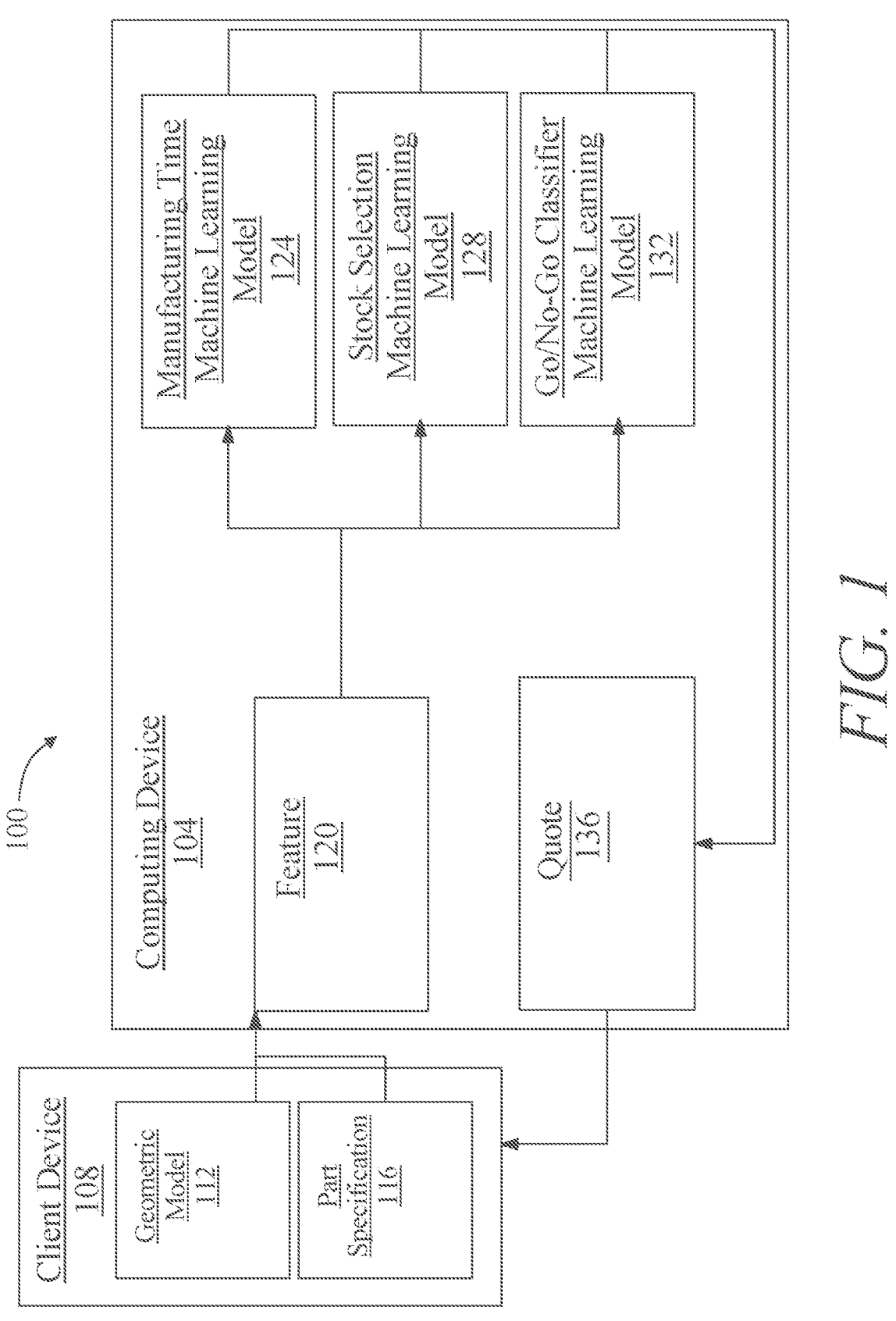
FIG. 1 is a block diagram representing an exemplary system for generating an instantaneous quote of any part without toolpathing.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

At a high level, aspects of the present disclosure are directed to systems and methods for generating an automatic quote for a custom part instantaneously and without a need for toolpathing. In an embodiment, instantaneous quoting may include one or more machine learning processes.

Aspects of the present disclosure can be used to generating quotations for custom manufactured prices instantaneously without a need for computationally expensive toolpathing or expert user oversight to ensure that appropriate manufacturing parameter inputs are being assumed during quotation process. Today, additive manufacturing of a custom parts is commonly automatically quoted. This is the case as manufacturing inputs for additive manufacturing are far fewer and cost estimating algorithms are far simpler than those for subtractive manufacturing, such as machining. So while a designer or manufacturer can receive an immediate quote for a 3D printed part, the designer commonly must wait for a quotation for a price to manufacture a machined part. Current attempts to provide an automatic estimate, or quotation, for machined parts (or parts whose manufacture involves a machining step) often include a toolpathing step. Toolpathing is a complex and computationally expensive step in which a machine tool's path required for manufacture of a part is determined. Often toolpathing can require use of computer-aided manufacturing (CAM) software tools. CAM software in some cases, may have an expense to operate that is comparable to that of machine tools themselves. Using expensive manufacturing tools, like CAM software, during a quoting process and prior to receiving a purchase order represents a large sales expense. As used in this disclosure, "computer-aided manufacturing (CAM) resource" is a resource that generates manufacturing instructions for a tool. For example, in some cases, a CAM resource may generate a toolpath based upon a geometric model. Non-limiting exemplary CAM resources include GibbsCAM from GibbsCAM of Moorpark, California, U.S.A and ESPRIT from DP Technology of Camarillo, California, U.S.A, MasterCAM from CNC Software inc. of Tolland, Connecticut, U.S.A., CAMWorks from HCL Technologies of Noida, India, SOLIDWORKS® CAM from Dassault Systèmes of Vélizy-Villacoublay, France, and the like. Additional disclosure related to automatic quoting and toolpath generation may be found in U.S. Pat. No. 8,140,401 entitled "AUTOMATED QUOTING OF MOLDS AND PARTS FRM CUSTOMER CAD FILE PART DATA," by L. Lukis et al., incorporated herein by reference. As used in this disclosure, a "toolpath" is a set of instructions required for a tool to manufacture a part. In some cases, a toolpath may literally include a tool path or a set of directions for a tool, such as a cuter, to move during manufacturing.

Aspects of the present disclosure can be used to provide an instantaneous quotation without expensive toolpathing processes. Exemplary embodiments illustrating aspects of the present disclosure are described below in the context of several specific examples.

Referring now to FIG. 1, an exemplary embodiment of a system 100 for generating an instantaneous quote of any part without toolpathing is illustrated. As used in this disclosure, "toolpathing" is a process of generating a toolpath for a computer numeric control (CNC) machine tool. In some cases, toolpathing may include a computer aided manufacturing (CAM) software. System 100 may include a computing device 104. Computing device 104 may include any computing device as described in this disclosure, including without limitation a microcontroller, microprocessor, digital signal processor (DSP) and/or system on a chip (SoC) as described in this disclosure. Computing device may include, be included in, and/or communicate with a mobile device such as a mobile telephone or smartphone. Computing device 104 may include a single computing device operating independently, or may include two or more computing device operating in concert, in parallel, sequentially or the like; two or more computing devices may be included together in a single computing device or in two or more computing devices. Computing device 104 may interface or communicate with one or more additional devices as described below in further detail via a network interface device. Network interface device may be utilized for connecting computing device 104 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Computing device 104 may include but is not limited to, for example, a computing device or cluster of computing devices in a first location and a second computing device or cluster of computing devices in a second location. Computing device 104 may include one or more computing devices dedicated to data storage, security, distribution of traffic for load balancing, and the like. Computing device 104 may distribute one or more computing tasks as described below across a plurality of computing devices of computing device, which may operate in parallel, in series, redundantly, or in any other manner used for distribution of tasks or memory between computing devices. Computing device 104 may be implemented using a "shared nothing" architecture in which data is cached at the worker, in an embodiment, this may enable scalability of system 100 and/or computing device.

With continued reference to FIG. 1, computing device 104 may be designed and/or configured to perform any method, method step, or sequence of method steps in any embodiment described in this disclosure, in any order and with any degree of repetition. For instance, computing device 104 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Computing device 104 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

With continued reference to FIG. 1, a computing device 104 is shown in communication with a client device 108. Client device 108 may be in communication with computing device 104 by way of any method described in this disclosure, including without limitation by way of at least a network. In some cases, client device 108 may include any computing device described in this disclosure. Client device 108 may communicate a geometric model 112 to computing device 104. As used in this disclosure, a "geometric model" is a representation of a physical component, such as a part that may be manufactured. A geometric model may include a computer-aided design (CAD) model, for example a CAD model generated by computer-aided design (CAD) software. In some cases, a geometric model may alternatively be referred to herein as a computer model. A computer model may include a 3d model and/or one or more 2d models, such as without limitation, digital prints or drawings. A computer model 108 may include a digital model of a physical structure as created using computer-aided design (CAD) modeling software. For example and without limitation, computer-aided design (CAD) software may include SOLIDWORKS® software and/or CATIA software (available from Dassault Systèmes of Vélizy-Villacoublay, France), AUTOCAD® software and/or Fusion 360 software (available from Autodesk, Inc., San Rafael, California), PTC Creo software (available from PTC, Inc., Boston, Massachusetts), Siemens NX software (available from Siemens PLM Software, Plano, Texas) and MICROSTATION® software (available from Bentley Systems, Inc., Exton, Pennsylvania), and the like. computer model 108 may include any modeling type, such as, without limitation, a wireframe, solid model and/or any combination thereof. The computer model may be saved in a computer file using any suitable file protocol, such as, without limitation, SolidWorks part file (.SLDPRT), several SolidWorks part files organized into a single assembly (.SLDASM), 3D assembly file supported by various mechanical design programs (.STP), graphics file saved in a 2D/3D vector format based on the Initial Graphics Exchange Specification (.IGS) and/or the like. The computer model further includes information about the geometry and/or other defining properties of the mechanical part's structure. computer model 108, in some cases, may include a triangulated surface (e.g., .STLfile). In some cases, computer model 108 may be representative of a part for manufacture. As used in this disclosure, a "part" is any physical object that is manufactured. A part may be designed for manufacture, for example by using computer-aided design software. Manufacture may include subtractive manufacturing method, including machining, milling, and/or turning. Alternatively or additionally, in some cases, manufacture may include additive manufacturing. Non-limiting additive manufacturing methods may include fused deposition manufacturing (FDM), selective laser melting (SLM), selective laser sintering (SLS), direct selective laser sintering (DSLM), multi-jet fusion (MJF), PolyJet, carbon digital light synthesis (DLS), continuous liquid interface production (CLIP), and the like.

With continued reference to FIG. 1, in some embodiments, client device 108 may communicate at least a part specification 116 to computing device. As used herein, a "part specification" may include any element of data associated with a part. For example, a part specification may include without limitation one or more of a quantity to be quoted, a part material, a part revision, a part number, a part description, a preferred vendor, and the like. In some cases, at least a part specification 116 may include part data. Part data may include any descriptive attributes of manufacturing request datum. "Descriptive attributes," as used in this disclosure, are any features, limitations, details, restrictions and/or specifications of manufacturing request datum. Descriptive attributes may include, without limitation, any features, limitations, details, restrictions and/or specifications relating to the CNC mechanical part geometry, materials, finishes, connections, hardware, special processes, dimensions, tolerances, and the like. Descriptive attributes may further include, without limitation, any features, limitations, details, restrictions, and/or specifications relating to a total request for manufacture, such as total amount of CNC mechanical parts, restrictions on deadline to have request completed, and the like. Persons skilled in the art, upon reviewing the entirety of this disclosure, will be aware of various descriptive attributes which may be suitable for part data consistent with this disclosure.

With continued reference to FIG. 1, computing device 104 may construct at least a feature 120 as a function of geometric model 112 and/or at least a part specification 116. As used in this disclosure, a "feature" is a representation used in a machine learning process. In some cases, a feature may be associated with a geometric model or part for manufacture. In some cases, a feature may be rotation invariant. As used in this disclosure, "rotation invariant" is an attribute that refers to somethings ability to remain unchanged by rotation, for example virtual rotation. In some cases, a rotation invariant feature may be constructed prior to a determination of a build orientation, i.e., rotational orientation of part during manufacture. In this case, a rotation variant feature may disadvantageously change, when build orientation is determined and the orientation of the part is rotated to the build orientation. In some cases, a geometric model 112 may be tessellated substantially before construction of a rotation-invariant feature. In some cases, tessellation may include representation of a geometric model 112 through a dataset comprising a plurality of polygons, for example triangles. In some cases, tessellation may be performed at a certain scale, wherein a size (e.g., area of each polygon) is maintained within a certain range. In some cases, a computation expense is inversely proportional to scale, such that smaller scales are more computationally expensive. In some cases, polygon area in tessellation may be substantially within a range of about X $mm^2$ to about Y $mm^2$.

Still referring to FIG. 1, in some embodiments, at least a feature 120 may include at least a rotation-invariant feature including a surface curvature feature. As used in this disclosure, a "surface curvature feature" is a feature that represents a geometric model's distribution of surface curvature. A surface of a geometric model 112 may be represented according to a number of methods. For example, a surface may be represented as a parametric form, as a loci associated to space curves, as a function of one or more variables, and through mesh generation. In some cases, a surface curvature feature may include calculation of a curvature at a plurality of points over a surface of a geometric model 112. Calculation of a curvature at a point on a surface of a geometric model may include calculation of principal curvature, Gaussian curvature, sectional curvature, mean curvature, Riemann curvature tensor, and the like. Principal curvatures, for example, at a given point of a surface may be two eigenvalues of a shape operator at the point, which represent how much the surface bends by different amounts in different directions at that point. Principal curvatures may be represented as a curvature within a principal plane, which defines direction of principal curvature being represented. Gaussian curvature of a given point on a surface is a product of two principal curvatures at the given point, and may be expressed as $$K = \kappa_1 \kappa_2$$

where K is Gaussian curvature, $\kappa_1$ is principal curvature in a first principal plane, and $\kappa_2$ is principal curvature in a second principal plane. Gaussian radius of curvature at a point may be represented as an inverse of Gaussian curvature, 1/K. For example, Gaussian radius of curvature at a point on a sphere may be represented as $1/r^2$, where r is radius of the sphere. In some embodiments, surface curvature feature may be based upon a distribution of primary surface curvature and secondary surface curvature evaluated and evaluated and integrated over a surface of a geometric model.

Still referring to FIG. 1, in some embodiments, at least a feature 120 may include at least a rotation-invariant feature including a co-occurrence histogram. As used in this disclosure, a "co-occurrence histogram" is a representation of redundant or co-occurring data, in some cases, a co-occurrence histogram may include a matrix or another data structure or form. According to some embodiments, surface orientation over a geometric model 112 may be determined relative a canonical direction. In some cases, a canonical direction may be so chosen to limit computational expense. Surface orientation, part thickness, and distance to occluding geometry may be evaluated at a plurality of points or continually over a surface of a geometric model 112. A co-occurrence histogram may be generated which represents one or more of surface orientation, part thickness, and/or distance to occluding geometry. In some cases, co-occurrence histogram may be substantially insensitive to tessellation accuracy, thereby allowing for tessellation to be performed at larger scales and less computational expense.

Still referring to FIG. 1, in some embodiments, at least a feature 120 may include at least a rotation-invariant feature including a convex hull feature. As used in this disclosure, a "convex hull feature" is a feature that represents a geometric model's convex hull. In some cases, a convex hull may be used as a macro features. As used in this disclosure, a "macro feature" is a feature that may aid in determination of macro classification, for example classification of part type, compactness of part, flatness of part, and the like. In some cases, a convex hull may be a measure of a part that is approximately equal to a volume of a convex hull divided by a volume of a part.

Still referring to FIG. 1, in some embodiments, at least a feature 120 may include at least a rotation-invariant feature including a decomposition of patches. As used in this disclosure, a "decomposition of patches" is an aggregated representation of a geometric model that is constituted from patches. In some cases, patches may be differentiated and/or classified as a function of surface curvature. For example, in some cases, patches may be differentiated as substantially convex or substantially concave. In some cases, distribution and/or frequency of patches may be calculated from a decomposition of patches. Frequency of patches may aid in determination of go/no-go classification as described below. For example, parts with many hard to machine details, such as gears and cooling fines, may exhibit a high value for frequency of patches.

With continued reference to FIG. 1, computing device 104 may use one or more machine learning processes (e.g., models and/or algorithms) in generating an instantaneous quote, in accordance with some embodiments. Computing device 104 may perform determinations, classification, and/ or analysis steps, methods, processes, or the like as described in this disclosure using machine learning processes. A "machine learning process," as used in this disclosure, is a process that automatedly uses a body of data known as "training data" and/or a "training set" to generate an algorithm that will be performed by a computing device/ module to produce outputs given data provided as inputs; this is in contrast to a non-machine learning software program where the commands to be executed are determined in advance by a user and written in a programming language.

With continued reference to FIG. 1, computing device 104 may predict a manufacturing time as a function of at least a feature 120 and a manufacturing time machine learning model 124. As used in this disclosure, a "manufacturing time" is an amount of time to perform at least a manufacturing operation. A manufacturing operation may include a milling operation and/or a turning operation. As used in this disclosure, a "manufacturing time machine learning model" is a machine learning model that outputs an estimated manufacturing time. According to some embodiments, a manufacturing time machine learning model may take as input a geometric model of a part, a part specification 116, a stock selection, and/or at least a feature representative of a part. Manufacturing time machine learning model may include any machine learning model and/or machine learning process described in this disclosure, for example with reference to FIGS. 2-4. In some cases, a manufacturing time machine learning model may be trained using any training data as described in this disclosure. In some cases, a manufacturing time machine learning model 124 may be trained using manufacturing time training data. Manufacturing time training data may include data elements that correlate input data representing one or more of a geometric model 112, a part specification 116, a stock selection, and at least a feature 120 to output data representing manufacturing time data. In some cases, manufacturing time data may include historical or other deterministic data associated with a known time for completing manufacture of a part. Alternatively or additionally, manufacturing time data may include an estimated and/or modeled manufacturing time for example as may be generated by CAM software after a toolpathing routine.

With continued reference to FIG. 1, computing device 104 may select a stock as a function of at least a feature 116 and a stock selection machine learning model 128. As used in this disclosure, a "stock" is a starting material used to manufacture a part. In some cases, a stock may be a block or billet of material for example without limitation, polymer, metal, alloy, or the like. As used in this disclosure, a "stock selection machine learning model" is a machine learning model that outputs a predicted material stock. According to some embodiments, a stock selection machine learning model may take as input a geometric model 112 of a part and/or at least a feature 120 representative of a part. Stock selection machine learning model may include any machine learning model and/or machine learning process described in this disclosure, for example with reference to FIGS. 2-4. In some cases, stock selection machine learning model 128 may be trained using any training data described in this disclosure. In some cases, stock selection machine learning model 128 may be trained using stock selection training data. Stock selection training data may include data elements that correlate input data representing one or more of a geometric model 112 and at least a feature 120 to output data stock selection data. In some cases, stock selection data may include historical or other deterministic data associated with a known previously selected stock for a part, which has been successfully manufactured. Alternatively or additionally, stock selection data may include an estimated, calculated, and/or modeled stock selection datum, for example as may be generated by CAM software.

With continued reference to FIG. 1, in some embodiments, computing device 104 may classify a quotation state as a function of at least a feature 120 and a go/no-go classifier machine learning model 132. As used in this disclosure, a "quotation state" is a process state related to a quotation. For example, a quotation state may include a "request for quotation" (RFQ) state after a quotation has been requested, a "quoted" state after a quote has been issued, a "no quote" state after a determination not to provide a quote has been determined, and an "accepted quote" state after a quotation has been accepted and an order has been placed. As used in this disclosure, a "go/no-go classifier machine learning model" is a machine learning model that outputs a binary determination, for example without limitation "go" or "no-go." In some cases, a go/no-go classifier machine learning model may be used to determine whether or not to quote or no quote a part for manufacture. Go/no-go classifier machine learning model may include any machine learning model and/or machine learning process described in this disclosure, including for example with reference to FIGS. 2-4. Training of go/no-go classifier machine learning model 132 may be performed using any training data and/or any training methods described in this disclosure, including for example with reference to FIGS. 2-4. In some cases, go/no-go classifier machine learning model 132 may be trained using go/no-go classifier training data. In some cases, go/no-go classifier training data may include data elements correlating input data representing one or more of geometric model 112, part specification, manufacturing time data, stock selection data, and at least a feature 120 to output data representing one or more of manufacturing time data, stock selection data, go/no-go determination data, and manufacturing cost data. Go/no-go determination data and/or manufacturing cost determination data may include historical or other deterministic data associated with a known previously manufactured part, which has been successfully or unsuccessfully manufactured. Alternatively or additionally, go/no-go determination data and/or manufacturing cost determination data may include one or more of an estimated, calculated, and/or go/no-go determination datum and/or a manufacturing cost datum, for example as may be generated by CAM software or another more computationally expensive means.

Still referring to FIG. 1, in some embodiments, go/no-go classifier machine learning model 132 may be trained as a function of an F-measure function and a desired false positivity rate. As used in this disclosure, an "F-measure function" is an expression of accuracy that includes precision and recall. As used in this disclosure, "precision" is measure approximately equal to a number of true positive results divided by a number of total positive results. As used in this disclosure, "recall," sometimes referred to as sensitivity is a measure approximately equal to a number of true positive results divided by an actual number of true positives in a sample. As used in this disclosure, a "false positivity rate" is a measure approximately equal to a number of false positives divided by an actual number of negative events in a sample.

With continued reference to FIG. 1, computing device 104 may estimate a quote 136. In some cases, computing device may estimate quote as a function of manufacturing time and stock, using outputs from manufacturing time machine learning model 124 and stock selection machine learning model 128. As used in this disclosure, a "quote" is a price estimate for manufacture of a part; quote in certain cases, can be a "no quote," which may be considered a price quote of theoretically infinite price. A quote 136 in some cases, may include a margin for one or more shareholders, for example without limitation machinists. In some cases, a quote may include a quotation state, e.g. "no quote." In some cases, a quote 136 may be constituted of an estimated price for manufacturing time and an estimated price related to cost of material. as a function of the manufacturing time and the stock.

Still referring to FIG. 1, in some embodiments, computing device 104 may communicate quote 136 to client device 108, for example by way of one or more networks. In some cases, a time delay between client device 108 communicating at least one of geometric model 112 and at least a part specification 116 to computing device 104 and computing device 104 communicating a quote to client device is 108 negligible; for example without limitation, the time delay may be less than 5 minutes, less than 1 minutes, less than 30 seconds, and/or less than 5 seconds.

Still referring to FIG. 1, in some embodiments, computing device 104 may be configured to train one or more machine learning models, such as without limitation, manufacturing time machine learning model 124, stock selection machine learning model 128, and/or go/no-go classifier machine learning model. Computing device 104 may use any training data, training method, and/or machine learning process or algorithm described within this disclosure in training a machine learning model, including those described with reference to FIGS. 2-4. In some embodiments, computing device 104 may train manufacturing time machine learning model 124 as a function of manufacturing time training data comprising at least an element of data comprising a logarithmic representation of manufacturing time. For example, in some cases, a logarithmic representation of time may include:

$$\log t_{mfg}$$

where $t_{mfg}$ is manufacturing time in some units, such as without limitation seconds, minutes, and/or hours. In some cases, a logarithmic representation of manufacturing time, such as that expressed above, may be used to approximate a mean average percentage error (MAPE) metric while being tractable by a machine learning process. In some cases, an optimization machine learning algorithm is used to generate and/or train manufacturing time machine learning model. In some cases, optimization machine learning algorithm may optimize using a sum of squared errors approach, and sum of squared logarithm error may be optimized.

Figure 2:
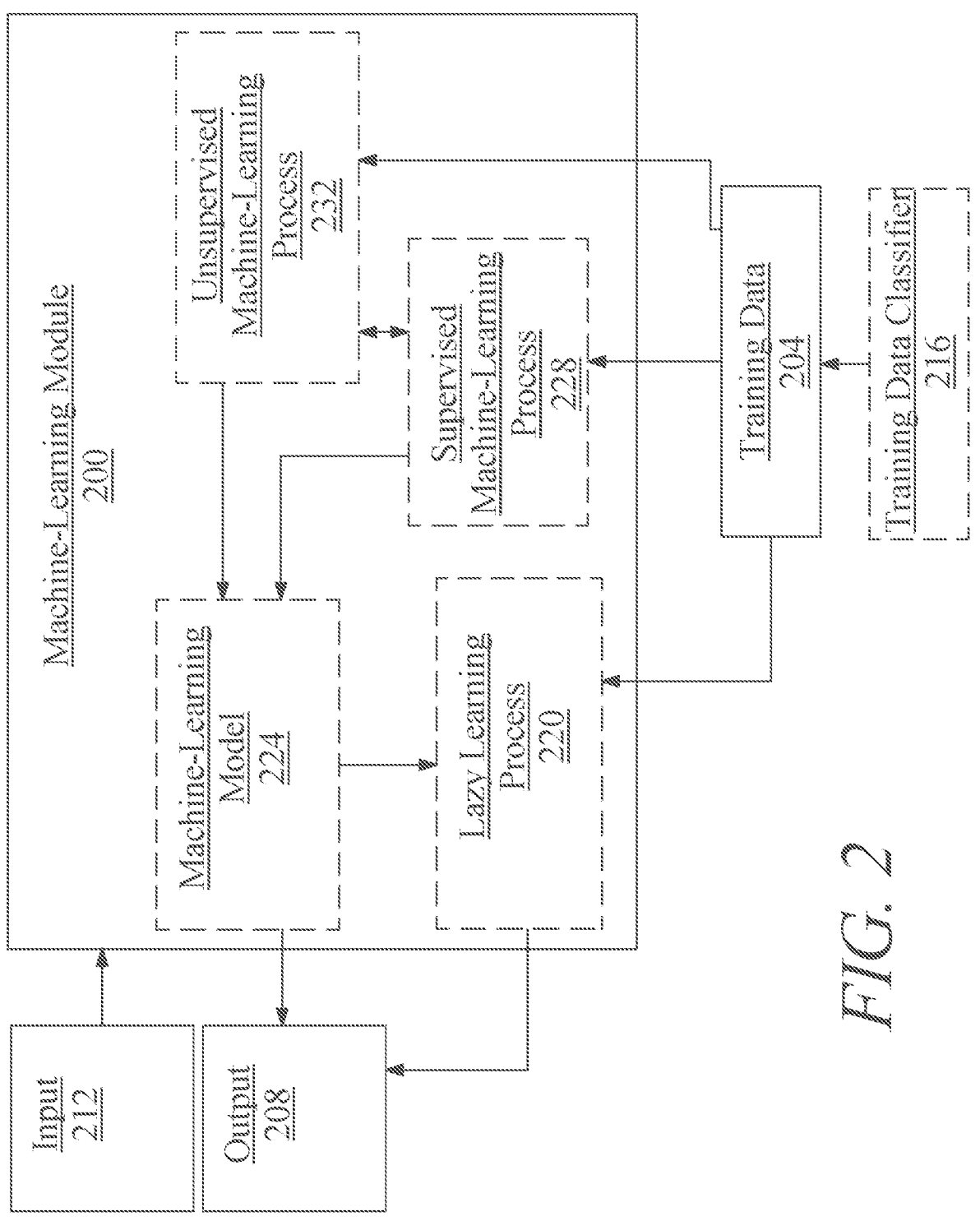
FIG. 2 is a block diagram representing exemplary machine learning processes.

Referring now to FIG. 2, an exemplary embodiment of a machine-learning module 200 that may perform one or more machine-learning processes as described in this disclosure is illustrated. Machine-learning module may perform determinations, classification, and/or analysis steps, methods, processes, or the like as described in this disclosure using machine learning processes. As described above, machine learning process may include any process that automatedly uses training data 204 to generate an algorithm that will be performed by a computing device/module to produce outputs 208 given data provided as inputs 212; this is in contrast to a non-machine learning software program where the commands to be executed are determined in advance by a user and written in a programming language.

Still referring to FIG. 2, "training data," as used herein, is data containing correlations that a machine-learning process may use to model relationships between two or more categories of data elements. For instance, and without limitation, training data 204 may include a plurality of data entries, each entry representing a set of data elements that were recorded, received, and/or generated together; data elements may be correlated by shared existence in a given data entry, by proximity in a given data entry, or the like. Multiple data entries in training data 204 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 204 according to various correlations; correlations may indicate causative and/or predictive links between categories of data elements, which may be modeled as relationships such as mathematical relationships by machine-learning processes as described in further detail below. Training data 204 may be formatted and/or organized by categories of data elements, for instance by associating data elements with one or more descriptors corresponding to categories of data elements. As a non-limiting example, training data 204 may include data entered in standardized forms by persons or processes, such that entry of a given data element in a given field in a form may be mapped to one or more descriptors of categories. Elements in training data 204 may be linked to descriptors of categories by tags, tokens, or other data elements; for instance, and without limitation, training data 204 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 2, training data 204 may include one or more elements that are not categorized; that is, training data 204 may not be formatted or contain descriptors for some elements of data. Machine-learning algorithms and/or other processes may sort training data 204 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 204 to be made applicable for two or more distinct machine-learning algorithms as described in further detail below. Training data 204 used by machine-learning module 200 may correlate any input data as described in this disclosure to any output data as described in this disclosure. As a non-limiting illustrative example training data may include input data elements that include one or more of geometric model 112, part specification 116, and/or at least a feature 120 and output data elements that include one or more of manufacturing time data, stock selection data, go/no-go determination data, and manufacturing cost data.

Further referring to FIG. 2, training data may be filtered, sorted, and/or selected using one or more supervised and/or unsupervised machine-learning processes and/or models as described in further detail below; such models may include without limitation a training data classifier 216. Training data classifier 216 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Machine-learning module 200 may generate a classifier using a classification algorithm, defined as a processes whereby a computing device and/or any module and/or component operating thereon derives a classifier from training data 204. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers. As a non-limiting example, training data classifier 216 may classify elements of training data to according to stock characteristic (e.g., stock size, stock material, and the like), manufacturing process (e.g., milling vs. turning), manufacturing tool selection (e.g., 3-axis mill, 5-axis mill, Swiss turn machine, 8-axis lathe, screw machine, and the like). In some cases, training data may be classified according to an output from another machine learning process. For example, in some cases, training data for one or more manufacturing time machine learning model 124 and go/no-go classifier machine learning model may be selected according to an output of stock selection machine learning model, such as without limitation after determining stock for manufacturing part.

Still referring to FIG. 2, machine-learning module 200 may be configured to perform a lazy-learning process 220 and/or protocol, which may alternatively be referred to as a "lazy loading" or "call-when-needed" process and/or proto-col, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 204. Heuristic may include selecting some number of highest-ranking associations and/or training data 204 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 2, machine-learning processes as described in this disclosure may be used to generate machine-learning models 224. A "machine-learning model," as used in this disclosure, is a mathematical and/or algorithmic representation of a relationship between inputs and outputs, as generated using any machine-learning process including without limitation any process as described above, and stored in memory; an input is submitted to a machine-learning model 224 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 224 may be generated by creating an artificial neural network, such as a convolutional neural network comprising an input layer of nodes, one or more intermediate layers, and an output layer of nodes. Connections between nodes may be created via the process of "training" the network, in which elements from a training data 204 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 2, machine-learning algorithms may include at least a supervised machine-learning process 228. At least a supervised machine-learning process 228, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include rotational-invariant features 120 as described above as inputs, manufacturing time data outputs, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 204. Persons skilled in the art, upon reviewing the entirety of this disclosure, will be aware of various possible variations of at least a supervised machine-learning process 228 that may be used to determine relation between inputs and outputs. Supervised machine-learning processes may include classification algorithms as defined above.

Further referring to FIG. 2, machine learning processes may include at least an unsupervised machine-learning processes 232. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 2, machine-learning module 200 may be designed and configured to create a machine-learning model 224 using techniques for development of linear regression models. Linear regression models may include ordinary least squares regression, which aims to minimize the square of the difference between predicted outcomes and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 2, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

Figure 3:
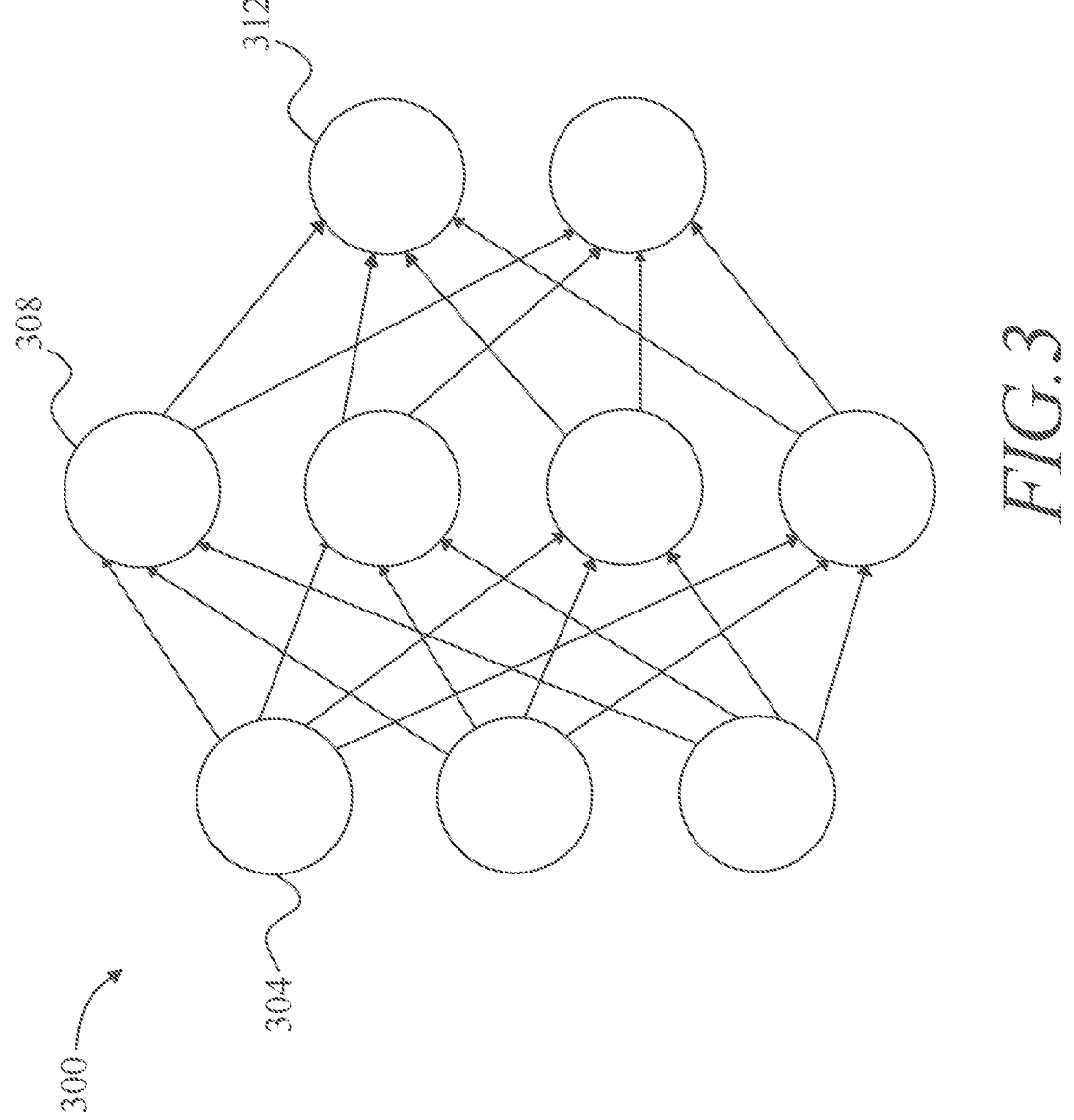
FIG. 3 is an illustration of an exemplary neural network.

Referring now to FIG. 3, an exemplary embodiment of neural network 300 is illustrated. A neural network 300 also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes, one or more intermediate layers, and an output layer of nodes. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning. Connections may run solely from input nodes toward output nodes in a "feed-forward" network, or may feed outputs of one layer back to inputs of the same or a different layer in a "recurrent network."

Figure 4:
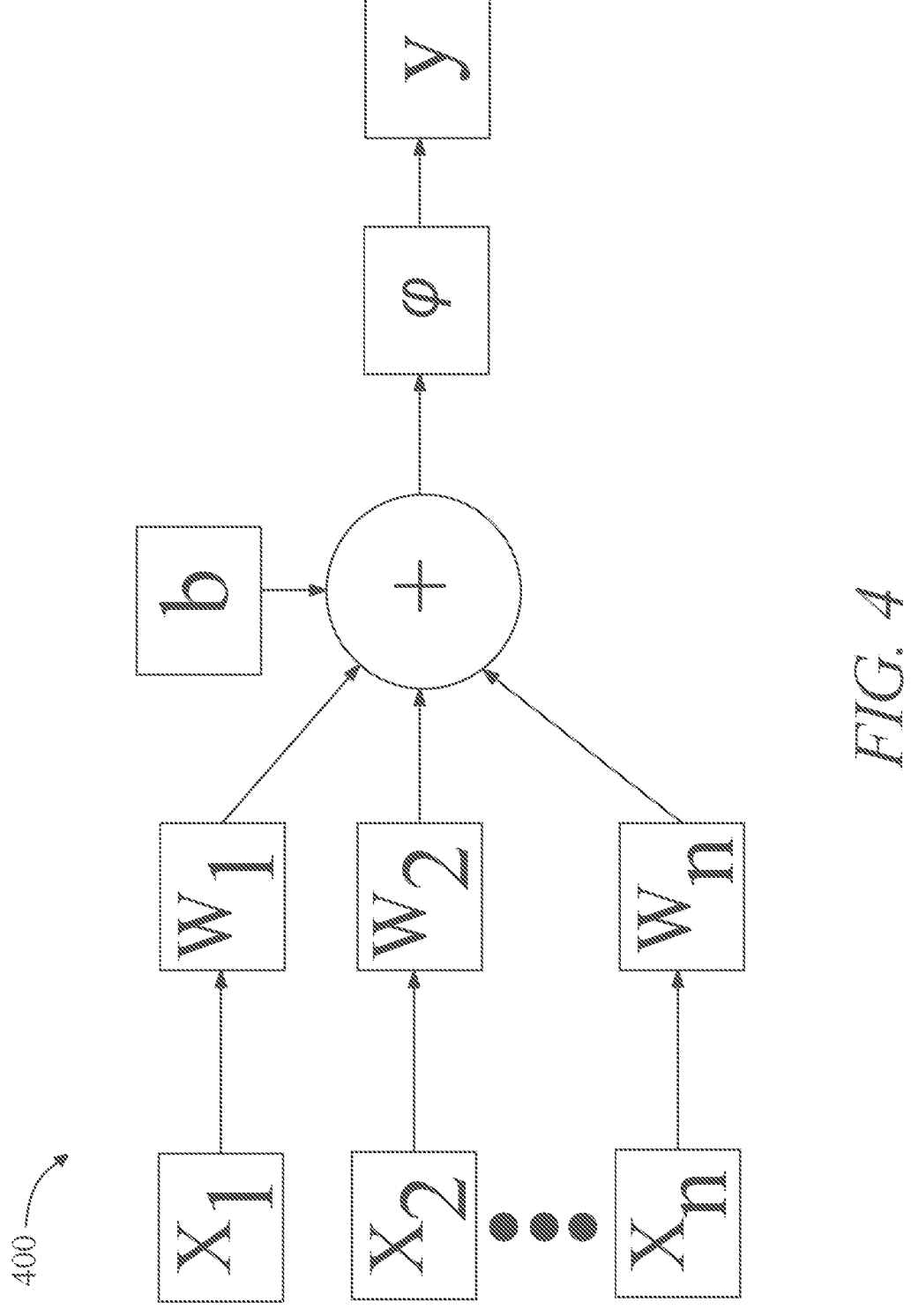
FIG. 4 is an exemplary node of a neural network.

Referring now to FIG. 4, an exemplary embodiment of a node of a neural network is illustrated. A node may include, without limitation a plurality of inputs $x_i$ that may receive numerical values from inputs to a neural network containing the node and/or from other nodes. Node may perform a weighted sum of inputs using weights $w_i$ that are multiplied by respective inputs $x_i$. Additionally or alternatively, a bias b may be added to the weighted sum of the inputs such that an offset is added to each unit in the neural network layer that is independent of the input to the layer. The weighted sum may then be input into a function $\varphi$, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above.

Figure 5:
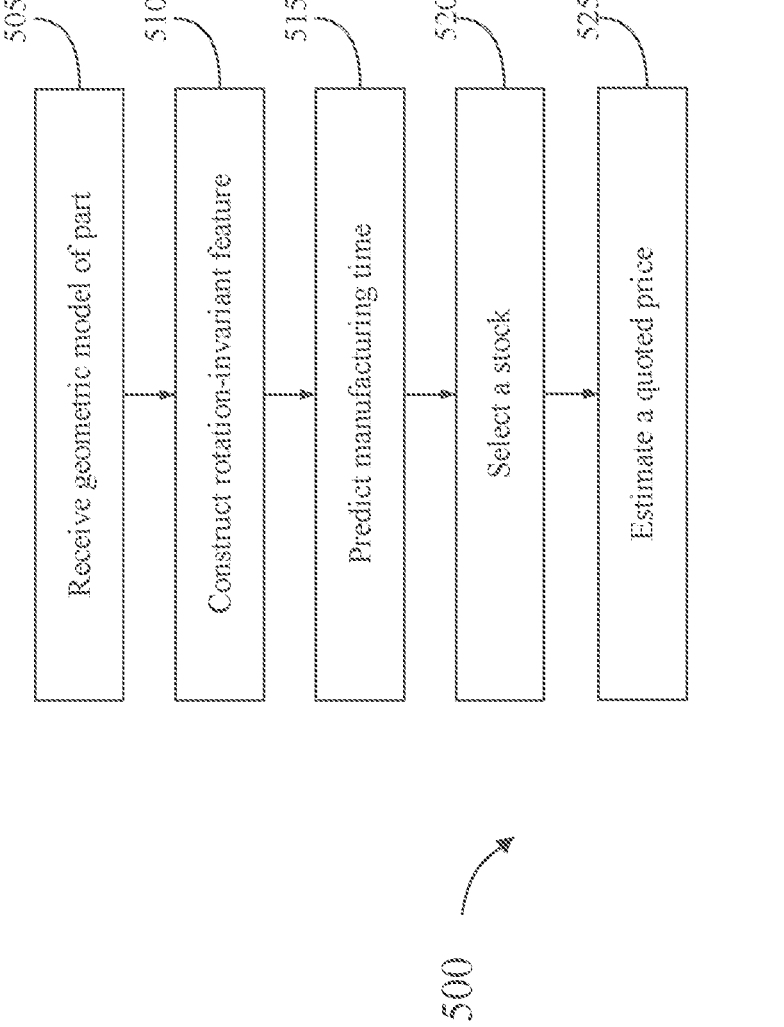
FIG. 5 is an exemplary method of generating an instantaneous quote of any part without toolpathing.

Referring now to FIG. 5, a method 500 of generating an instantaneous price quote of any part without toolpathing is illustrated by way of a flow diagram. At step 505, computing device may receive a geometric model of a part. Computing device may include any computing device described in this disclosure, including without limitation in reference to FIGS. 1-4 and 6. Geometric model may include any geometric model described in this disclosure, including for example with reference to FIGS. 1-4. Part may include any part described in this disclosure, including for example with reference to FIGS. 1-4.

With continued reference to FIG. 5, at step 510, computing device may construct at least a rotation-invariant feature as a function of geometric model. Rotation invariant feature may include any feature described in this disclosure, including with reference to FIGS. 1-4. In some embodiments, at least a rotation-invariant feature includes a surface curvature feature. Surface curvature feature may include any surface curvature feature described in this disclosure, including in reference to FIGS. 1-4. In some embodiments, at least a rotation-invariant feature may include a co-occurrence histogram. Co-occurrence histogram may include any co-occurrence histogram described in this disclosure, including with reference to FIGS. 1-4. In some embodiments, at least a rotation-invariant feature may include a convex hull feature. Convex hull feature may include any convex hull feature described in this disclosure, including with reference to FIGS. 1-4. In some embodiments, at least a rotation-invariant feature may include a decomposition of patches. Decomposition of patches may include any decomposition of patches described in this disclosure, including with reference to FIGS. 1-4. In some embodiments, construction of at least a rotation-invariant feature further comprises generating a tessellated surface of the geometric model.

With continued reference to FIG. 5, at step 515, computing device may predict a manufacturing time as a function of at least a rotation-invariant feature and a manufacturing time machine learning model. Manufacturing time may include any manufacturing time described in this disclosure, including with reference to FIGS. 1-4. Manufacturing time machine learning model may include any machine learning model described in this disclosure, including with reference to FIGS. 1-4. In some embodiments, predicting manufacturing time further comprises predicting the manufacturing time as a function of stock, at least a rotation-invariant feature and manufacturing time machine learning model. In some cases, stock is selected prior to step 515.

With continued reference to FIG. 5, at step 520, computing device may select a stock as a function of at least a rotation-invariant and a stock selection machine learning model feature. Stock may include any stock described in this disclosure, including with reference to FIGS. 1-4. stock selection machine learning model may include any machine learning model described in this disclosure, including with reference to FIGS. 1-4.

With continued reference to FIG. 5, at step 525, computing device may estimate a quote as a function of manufacturing time and stock. Quote may include any quote described in this disclosure, for example with reference to FIGS. 1-4.

Still referring to FIG. 5, in some embodiments, method 500 may additionally include classifying, using computing device, a quotation state as a function of at least a rotation-invariant feature and a go/no-go classifier machine learning model. Quotation state may include any quotation state described in this disclosure, including with reference to FIGS. 1-4. Go/no-go classifier machine learning model may include any machine learning model described in this disclosure, including with reference to FIG. 1-4. In some cases, method 500 may additionally include training, using computing device, go/no-go classifier machine learning model according to an F-measure function and a desired false positivity rate. F-measure function may include any F-measure function described in this disclosure, including with reference to FIGS. 1-4. Desired false positivity rate may include any false positivity rate described in this disclosure, for example with reference to FIGS. 1-4.

Still referring to FIG. 5, in some embodiments, method 500 may additionally include training, using computing device, manufacturing time machine learning model as a function of manufacturing time training data. Manufacturing time training data may include any training data described in this disclosure, for example with reference to FIGS. 1-4. In some cases. manufacturing time training data may include at least an element of data constituting a logarithmic representation of manufacturing time. Logarithmic representation of manufacturing time may include any logarithmic representation of manufacturing time described in this disclosure, including with reference to FIGS. 1-4.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 6:
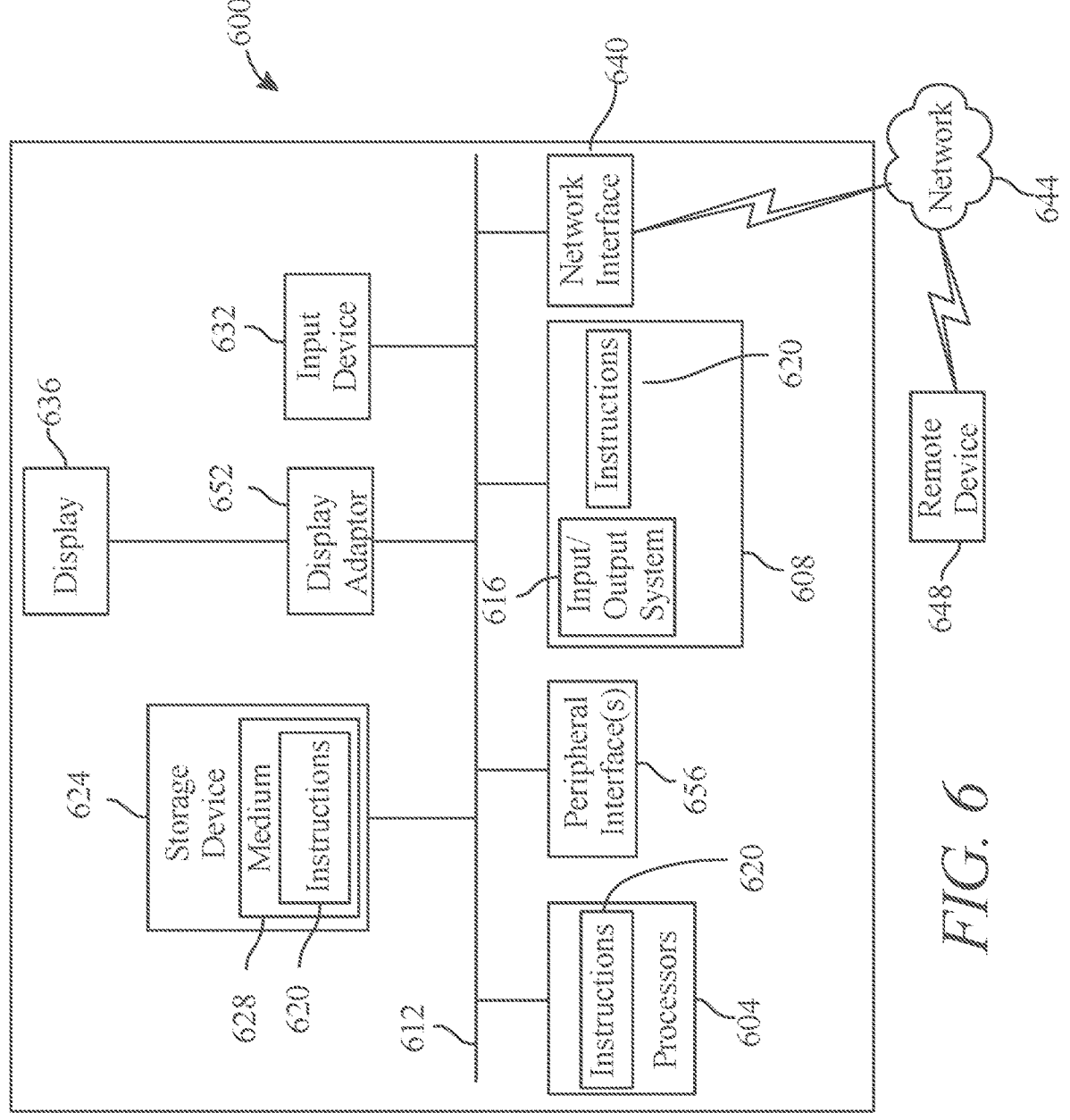
FIG. 6 is a block diagram of a computing system that can be used to implement any one or more of the methodologies disclosed herein and any one or more portions thereof.

FIG. 6 shows a diagrammatic representation of one embodiment of a computing device in the exemplary form of a computer system 600 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 600 includes a processor 604 and a memory 608 that communicate with each other, and with other components, via a bus 612. Bus 612 may include any of several types of bus structures including, but not limited to, a memory bus, a memory controller, a peripheral bus, a local bus, and any combinations thereof, using any of a variety of bus architectures.

Processor 604 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 604 may be organized according to Von Neumann and/or Harvard architecture as a non-limiting example. Processor 604 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Memory 608 may include various components (e.g., machine-readable media) including, but not limited to, a random-access memory component, a read only component, and any combinations thereof. In one example, a basic input/output system 616 (BIOS), including basic routines that help to transfer information between elements within computer system 600, such as during start-up, may be stored in memory 608. Memory 608 may also include (e.g., stored on one or more machine-readable media) instructions (e.g., software) 620 embodying any one or more of the aspects and/or methodologies of the present disclosure. In another example, memory 608 may further include any number of program modules including, but not limited to, an operating system, one or more application programs, other program modules, program data, and any combinations thereof.

Computer system 600 may also include a storage device 624. Examples of a storage device (e.g., storage device 624) include, but are not limited to, a hard disk drive, a magnetic disk drive, an optical disc drive in combination with an optical medium, a solid-state memory device, and any combinations thereof. Storage device 624 may be connected to bus 612 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 624 (or one or more components thereof) may be removably interfaced with computer system 600 (e.g., via an external port connector (not shown)). Particularly, storage device 624 and an associated machine-readable medium 628 may provide nonvolatile and/or volatile storage of machine-readable instructions, data structures, program modules, and/or other data for computer system 600. In one example, software 620 may reside, completely or partially, within machine-readable medium 628. In another example, software 620 may reside, completely or partially, within processor 604.

Computer system 600 may also include an input device 632. In one example, a user of computer system 600 may enter commands and/or other information into computer system 600 via input device 632. Examples of an input device 632 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 632 may be interfaced to bus 612 via any of a variety of interfaces (not shown) including, but not limited to, a serial interface, a parallel interface, a game port, a USB interface, a FIREWIRE interface, a direct interface to bus 612, and any combinations thereof. Input device 632 may include a touch screen interface that may be a part of or separate from display 636, discussed further below. Input device 632 may be utilized as a user selection device for selecting one or more graphical representations in a graphical interface as described above.

A user may also input commands and/or other information to computer system 600 via storage device 624 (e.g., a removable disk drive, a flash drive, etc.) and/or network interface device 640. A network interface device, such as network interface device 640, may be utilized for connecting computer system 600 to one or more of a variety of networks, such as network 644, and one or more remote devices 648 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 644, may employ a wired and/or a wireless mode of communication. In general, any network topology may be used. Information (e.g., data, software 620, etc.) may be communicated to and/or from computer system 600 via network interface device 640.

Computer system 600 may further include a video display adapter 652 for communicating a displayable image to a display device, such as display device 636. Examples of a display device include, but are not limited to, a liquid crystal display (LCD), a cathode ray tube (CRT), a plasma display, a light emitting diode (LED) display, and any combinations thereof. Display adapter 652 and display device 636 may be utilized in combination with processor 604 to provide graphical representations of aspects of the present disclosure. In addition to a display device, computer system 600 may include one or more other peripheral output devices including, but not limited to, an audio speaker, a printer, and any combinations thereof. Such peripheral output devices may be connected to bus 612 via a peripheral interface 656. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of generating an instantaneous quote of a computer numeric control (CNC) part without toolpathing, the method comprising:

receiving, using a computing device, a geometric model of a part to be manufactured using subtractive manufacturing comprising CNC manufacturing;

constructing, using the computing device, at least a rotation-invariant feature as a function of the geometric model, wherein:

the at least a rotation-invariant feature is in a form adapted for use in a machine learning process and comprises a co-occurrence histogram representative of redundant or co-occurring data in the geometric model of the part to be manufactured; and the co-occurrence histogram comprises a co-occurrence matrix including a plurality of elements comprising at least a distance to occluding geometry which is evaluated over a surface of the geometric model of the part to be manufactured;

predicting, by the computing device, a manufacturing time for the part by:

receiving, from a client device, a computer-aided design (CAD) file storing the geometric model of the part;

generating a tessellated surface representation of the geometric model;

constructing the at least one rotation-invariant feature by generating the co-occurrence histogram in matrix form that represents at least one of surface orientation, part thickness, and the distance to occluding geometry; and providing the co-occurrence matrix to a manufacturing time machine-learning model stored in memory and comprising a first artificial neural network (ANN) to output the manufacturing time, wherein the manufacturing time comprises a predicted time to perform at least a milling operation;

selecting, using the computing device, a stock as a function of the at least a rotation-invariant feature, including the co-occurrence matrix, and a stock selection machine learning model comprising a second ANN; and estimating, using the computing device, a quote as a function of the manufacturing time, including the time to perform the at least a milling operation, and the stock for CNC manufacturing of the part to be manufactured without generating a toolpath for a CNC machine tool during the prediction of the manufacturing time, the selection of the stock and the estimation of the quote.

2. The method of claim 1 further comprising classifying, using the computing device, a quotation state as a function of the at least a rotation-invariant feature and a go/no-go classifier machine learning model.

3. The method of claim 2, further comprising training, using the computing device, the go/no-go classifier machine learning model according to an F-measure function and a desired false positivity rate.

4. The method of claim 1, further comprising training, using the computing device, the manufacturing time machine learning model as a function of manufacturing time training data comprising at least an element of data comprising a logarithmic representation of manufacturing time.

5. The method of claim 1, wherein the at least a rotation-invariant feature comprises a surface curvature feature.

6. The method of claim 1, wherein the at least a rotation-invariant feature comprises a convex hull feature.

7. The method of claim 1, wherein the at least a rotation-invariant feature comprises a decomposition of patches.

8. The method of claim 1, wherein predicting the manufacturing time further comprises predicting the manufacturing time as a function of the stock, the at least a rotation-invariant feature and the manufacturing time machine learning model.

9. A system for generating an instantaneous quote of a computer numeric control (CNC) part without toolpathing, the system comprising a computing device configured to:

receive a geometric model of a part to be manufactured using subtractive manufacturing comprising CNC manufacturing;

construct at least a rotation-invariant feature as a function of the geometric model, wherein:

the at least a rotation-invariant feature is in a form adapted for use in a machine learning process and comprises a co-occurrence histogram representative of redundant or co-occurring data in the geometric model of the part to be manufactured; and the co-occurrence histogram comprises a co-occurrence matrix including a plurality of elements comprising at least a distance to occluding geometry which is evaluated over a surface of the geometric model of the part to be manufactured;

predict a manufacturing time for the part by:

receiving, from a client device, a computer-aided design (CAD) file storing the geometric model of the part;

generating a tessellated surface representation of the geometric model;

constructing the at least one rotation-invariant feature by generating the co-occurrence histogram in matrix form that represents at least one of surface orientation, part thickness, and the distance to occluding geometry; and providing the co-occurrence matrix to a manufacturing time machine-learning model stored in memory and comprising a first artificial neural network (ANN) to output the manufacturing time, wherein the manufacturing time comprises a predicted time to perform at least a milling operation;

select a stock as a function of the at least a rotation-invariant feature, including the co-occurrence matrix, and a stock selection machine learning model comprising a second ANN; and estimate a quote as a function of the manufacturing time, including the time to perform the at least a milling operation, and the stock for CNC manufacturing of the part to be manufactured without generating a toolpath for a CNC machine tool during the prediction of the manufacturing time, the selection of the stock and the estimation of the quote.

10. The system of claim 9 wherein the computing device is further configured to classify a quotation state as a function of the at least a rotation-invariant feature and a go/no-go classifier machine learning model.

11. The system of claim 10, wherein the computing device is further configured to train the go/no-go classifier machine learning model according to an F-measure function and a desired false positivity rate.

12. The system of claim 9, wherein the computing device is further configured to train the manufacturing time machine learning model as a function of manufacturing time training data comprising at least an element of data comprising a logarithmic representation of manufacturing time.

13. The system of claim 9, wherein the at least a rotation-invariant feature comprises a surface curvature feature.

14. The system of claim 9, wherein the at least a rotation-invariant feature comprises a convex hull feature.

15. The system of claim 9, wherein the at least a rotation-invariant feature comprises a decomposition of patches.

16. The system of claim 9, wherein predicting the manufacturing time further comprises predicting the manufacturing time as a function of the stock, the at least a rotation-invariant feature and the manufacturing time machine learning model.

\* \* \* \* \*